(12) United States Patent
Boieriu et al.

(10) Patent No.: US 12,532,552 B2
(45) Date of Patent: Jan. 20, 2026

(54) METASURFACE-COUPLED SINGLE PHOTON AVALANCHE DIODE FOR HIGH TEMPERATURE OPERATION

(71) Applicants: Paul Boieriu, Lake Zurich, IL (US); Srinivasan Krishnamurthy, Cupertino, CA (US); Christoph H Grein, Wheaton, IL (US)

(72) Inventors: Paul Boieriu, Lake Zurich, IL (US); Srinivasan Krishnamurthy, Cupertino, CA (US); Christoph H Grein, Wheaton, IL (US)

(73) Assignee: Sivananthan Laboratories, Inc., Bolingbrook, IL (US)

( * ) Notice: Subject to any disclaimer, the term of this patent is extended or adjusted under 35 U.S.C. 154(b) by 483 days.

(21) Appl. No.: 17/866,068

(22) Filed: Jul. 15, 2022

(65) Prior Publication Data
US 2023/0072648 A1    Mar. 9, 2023

Related U.S. Application Data

(60) Provisional application No. 63/222,048, filed on Jul. 15, 2021.

(51) Int. Cl.
*H10F 30/225* (2025.01)
*H10F 77/123* (2025.01)

(52) U.S. Cl.
CPC ....... *H10F 30/225* (2025.01); *H10F 77/1237* (2025.01)

(58) Field of Classification Search
None
See application file for complete search history.

(56) References Cited

U.S. PATENT DOCUMENTS

| | | | | |
|---|---|---|---|---|
| 2004/0245592 | A1* | 12/2004 | Harmon | H10F 30/225 257/E27.128 |
| 2015/0200222 | A1* | 7/2015 | Webster | H10F 30/225 250/208.1 |
| 2020/0098814 | A1* | 3/2020 | Yang | H01L 27/1463 |
| 2022/0359772 | A1* | 11/2022 | Siddique | H01L 27/1463 |
| 2023/0168376 | A1* | 6/2023 | Won | G01S 17/10 356/4.01 |

* cited by examiner

*Primary Examiner* — Benjamin P Sandvik
(74) *Attorney, Agent, or Firm* — Erickson Law Group, PC.

(57) ABSTRACT

A photon avalanche diode, includes a quartz substrate, a doped HgCdTe contact layer on the substrate, an absorbing HgCdTe layer on the contact layer, a larger bandgap HgCdTe layer on the absorbing layer, a doped HgCdTe layer for a top contact layer on the larger bandgap HgCdTe layer, and a non-absorbing HgCdTe metasurface on the top contact layer.

18 Claims, 9 Drawing Sheets

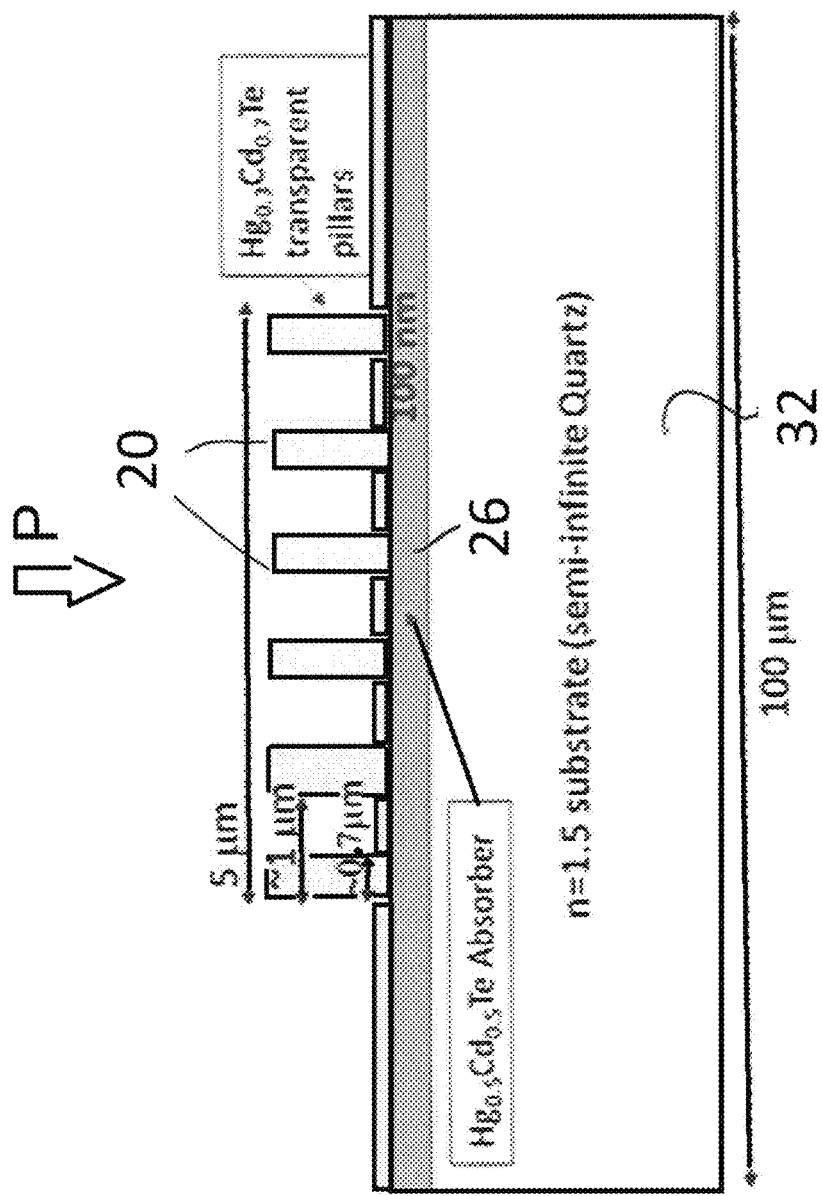
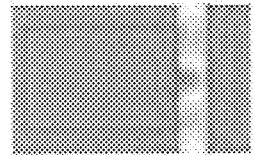
FIG. 1(a)
FIG. 1(b)

METASURFACE-COUPLED SINGLE PHOTON AVALANCHE DIODE FOR HIGH TEMPERATURE OPERATION

This application claims the benefit of U.S. Provisional Application Ser. No. 63/222,048, filed Jul. 15, 2021.

BACKGROUND

Single-photon detection is increasingly important to the emerging fields of quantum computation, sensing and cryptography, as well as to the more traditional fields requiring low-light detection.

In conventional avalanche photodiodes (APDs) operating at 1550 nm, with p-doped, intrinsic, n-doped ("PiN") or with separate absorber and multiplication (SAM) regions, the absorber thickness is at least 3 µm. In the PiN APDs, since the incident 1550 nm photons are randomly absorbed throughout that region, the avalanche gain envelope of the electron-photon pair is also random, leading to broadly dispersed random-sized pulse widths for each photon absorbed. If more than one photon is absorbed before the pulse collection is complete, the resulting pulse will be wider, owing to superposition of several envelopes. Consequently, the bandwidth is limited. Utilizing reduced absorber thickness will reduce the pulse width distribution and jitter time, but at an unacceptable cost of reduced absorption efficiency and PDE in conventional APDs. In the SAM APDs, the thicker absorber region introduces considerable dispersion in launching time of the charge carriers into the multiplication region, which in turn affects the jitter time adversely.

In either case, the present inventors have recognized the desirability of maintaining high detection efficiency, achieving high gain with large bandwidth and lower jitter time at room temperature.

Superconducting Nanowire Single-photon detectors (SNSPDs or simply SSPDs) have rapidly emerged as a highly promising photon counting technology for the wavelength range 500 nm to 1550 nm. These devices offer high efficiency, low dark counts and excellent timing resolution, advantageous for photon correlation spectroscopy for imaging with entangled photons. While SNSPDs continue to be prevalent in single photon detection studies with system detection efficiency>80%, they operate at cryogenic temperature, making them difficult to employ outside specialized environments. SNSPDs have excellent potential for time-correlated single-photon counting (TCSPC) in the infrared wavelength regime, where important new applications are emerging. The present inventors have recognized that the need for extreme cooling, 10's of ps timing jitter, and the lack of available technologies for integration to arrays and on-chip detection, are drawbacks with the current technology.

The SNSPDs have higher performance than APDs but have considerably poorer size, weight, and power performance (SWaP). In an APD, an incident photon triggers a self-sustaining avalanche event via impact ionization and individual photons become countable. For the single-photon detection in the near-infrared, group III-V heterostructure APDs such as InP/InGaAs with separate absorption, grading, charge and multiplication structures are advantageous. In these devices, an $In_{0.53}Ga_{0.47}As$ layer with a room-temperature band gap ($E_g$) of 0.75 eV is used as the absorption material, while the lattice-matched InP layer with a $E_g$ of 1.35 eV is used as the multiplication material. InP/InGaAs APDs operate at higher temperature but with poorer efficiency and longer resolution and time jitter. HgCdTe-based APDs are traditionally used in a PiN architecture, leading to long jitter time, large dark current and hence 77 K operation. A HgCdTe-based SAM structure used a thicker absorber under lower field (for 296 K operation) and the Cd concentration in the multiplication was not optimized, leading to large dark current and gain of only 10.

In quantum communication and quantum information processing, a reliable means of characterizing optical quantum states is balanced homodyne detection, which directly measures the quantum state interference with a bright laser that acts as a local oscillator (LO). From measurements of the quantum quadrature operator for different LO phases, the quantum state of the signal field can be constructed. The full potential of this measurement and reconstruction—called optical homodyne tomography—lies with its ability to detect a single photon using avalanche photodiodes.

Some examples of single photon avalanche diodes (SPAD) are described in U.S. Pat. Nos. 11,340,109; 11,329,185; 10,658,419; 10,153,310; 9,299,732 and 9,190,553. These patents are herein incorporated by reference to the extent their disclosures are not contrary to the present invention.

The present inventors have recognized the development of high-speed, reliable room-temperature single photon detectors, a counterpart of entangled photon sources, has the potential to be widely adopted by all users of quantum-based technologies. Replacing the current detectors with room-temperature APDs will make numerous technologies affordable and accessible to many uses: private and military secured communications through quantum encryption, complex problem solving through large scale quantum computing, accurate satellite positioning, or navigation of remote astral objects.

SUMMARY

An exemplary embodiment of the invention provides an APD with a metasurface.

An exemplary embodiment of the invention provides a photon SAM diode with a quartz substrate; a doped HgCdTe contact layer on the substrate; an absorbing HgCdTe layer on the contact layer; a larger bandgap HgCdTe layer on the absorbing layer; a doped HgCdTe layer for a top contact layer on the larger bandgap HgCdTe layer; and a non-absorbing HgCdTe metasurface on the top contact layer.

The larger bandgap HgCdTe layer comprises a transition layer on the absorbing HgCdTe layer and a multiplication layer on the transition layer.

The metasurface can be formed by a grid of pillars.

High-speed, reliable, room-temperature, single photon detectors will have high impact on the recent focus of applications employing quantum optics—secure communication, ultrafast computation, and light detection and ranging ("LIDAR") with very high signal to noise characteristics in support of US national defense, as well as increasing economic competitiveness of the applications. The proposed low SWaP M-SPAD single photon detector when coupled with a bright entangled-photon source has the potential to address numerous dual-use applications.

For military use, encrypted quantum communications will enable resilient information sharing within a heterogeneous mix of capable, trustworthy, autonomous systems as well as between theater operators and command centers, presenting the adversary with an ever-growing number of challenges that demand resource prioritization, increase vulnerabilities, while imparting overwhelming confusion. Given the low-light level and high signal to noise imaging ability, our proposed low SWaP technology would be a valuable asset as part of a network of sensors stealthy providing global persistent awareness.

Currently state-of-the-art SNSPDs operate at temperatures<3 K, with a reset time of 40 ns, and are not easily amenable to 2D arrays. In state-of-the art InP/InGaAs SAPDs, the dark current density near breakdown is ~2×10$^{-5}$ A/cm$^2$ at room temperature. To get dark counts to 10$^4$ per second, these SPADs must be cooled (~230 K) to reduce the dark current density. For room temperature operation, a dark current of 2×10$^{-7}$ A/cm$^2$ is desired.

An exemplary embodiment, with metasurface, reduces the absorber thickness by approximately 30 times. In this one embodiment, the metasurface elements—nanopillars—are all identical in size. However, when the elements' sizes are systematically varied in a unit cell, the metasurface can additionally focus light into the thin absorber. Since metasurfaces have been successfully demonstrated to effectively focus single wavelengths, the metasurface design can be tuned to collect light over an area with 25 μm diameter and focus it on to an absorber area of 20 μm diameter. In other words, a two-dimensional array of these devices with 25 μm pitch will have near unity fill factor, but with device collection areas reduced by ~25× (from the current value of 100 μm×100 μm). Consequently, the collection volume, and thus the dark current density, will be reduced by 750×, which exceeds the requirement for room-temperature operation. The exemplary embodiment has similarity with focal plane array-based infrared detection technology—with light and photocarriers traveling in the same direction—and hence is amenable to small pitch (~25 μm) and large format (1024× 1024) arrays.

The present inventors have recognized the desirability of metasurface-coupled APDs with high quantum efficiency and bandwidth, and low noise, which can be used in homodyne detectors for high-fidelity optical homodyne tomography. Owing to the broad applications of APDs in quantum information, 3-D laser/light ranging (LADAR/LiDAR), optical VLSI circuit inspection, and time-resolved spectroscopy, the exemplary embodiment of the invention would have an immediate and long-lasting impact.

The present inventors have recognized the desirability of low-noise metasurface-coupled HgCdTe single photon avalanche photodiodes (M-SPADs) operating at 1550 nm and at room temperature with photocarrier launching time-dispersion less than 2 ps which reduces the jitter time and increase the bandwidth by ~30% over the state of the art (SOA) HgCdTe APD operating at 77K. The invention will be useful for all applications requiring single photon detection with short deadtime. This technology will be in direct competition with superconducting nanowire single-photon detector (SNSPD), but with considerable advantages including (a) room temperature operation requiring much lower power, (b) pixelated detection with high fill-factor, (c) on-chip integration to a focal plane array (FPA), and (d) high detection efficiency.

State of the art HgCdTe APDs have been demonstrated to achieve a noiseless gain of over 1000 but operate at 77 K. A HgCdTe APD with separate absorption and multiplication (SAM) regions can operate at room temperature but has reported a gain of only 10 and too large a dark current density for it to be useful as a SPAD. An exemplary embodiment of a metasurface-coupled SPAD (M-SPAD) with a SAM architecture, is predicted to reduce the collection volume by three orders of magnitude and thus the dark current by a comparable amount, which will lead to several major improvements—shorter jitter time, larger bandwidth, higher gain, and room temperature operation.

The initial target application is in the field of quantum sensing. However, the envisioned enhancements in imaging, computing, metrology, and communication will have strong impact on other market segments including military and scientific and commercial space-based remote sensing that employ hyperspectral, spectral and thermal imaging for guidance, detection and measurement. In addition, the exemplary embodiment can address similar remote sensing and LIDAR needs for manned and unmanned aerial vehicles. Finally, terrestrial applications include remote sensing, quantum communications, medical thermal imaging, homeland security, industrial imaging, facility security and law enforcement.

A transparent metasurface embedded to an SAM APD enables near >90% absorption of 1550 nm light within a 100 nm-thick or thinner HgCdTe absorber. This metasurface will couple 1550 nm photons to HgCdTe-based APDs. This feature results in several advantages.

Since the photons are always absorbed within an ultrathin region (100 nm), the carriers injected into the transition and multiplication region will have very little launching time dispersion. All injected carriers are launched near simultaneously and experience near identical electric field distribution, possibly resulting in nearly identical avalanche envelopes and hence the avalanche current pulse width will be small, leading to high bandwidth. In addition, the restriction of absorption to a small volume reduces the shot noise.

A high-performance entangled photon source and its counterpart M-SPAD detector has numerous applications, both military and commercial. Enhanced positioning, navigation and tracking benefiting from the LIDAR mode of operation of the SWIR photon source will be advantageous to any system that requires a larger signal-to-noise ratio. Commercial applications such as the monitoring of HVAC systems, automobile exhausts, chemical warfare agents, pipe leaks, toxic waste and hazardous spills using an active source such as entangled photon source will enable faster detection and an improved ability to compensate for atmospheric conditions otherwise impeding the operation of current systems.

Numerous other advantages and features of the present invention will be become readily apparent from the following detailed description of the invention and the embodiments thereof, and from the accompanying drawings.

BRIEF DESCRIPTION OF THE DRAWINGS

FIG. 1a is a schematic sectional view of a metasurface-coupled absorber on a low index substrate;

FIG. 1b is a graph of COMSOL simulated spatial absorption profile;

DETAILED DESCRIPTION

Figure 1C:
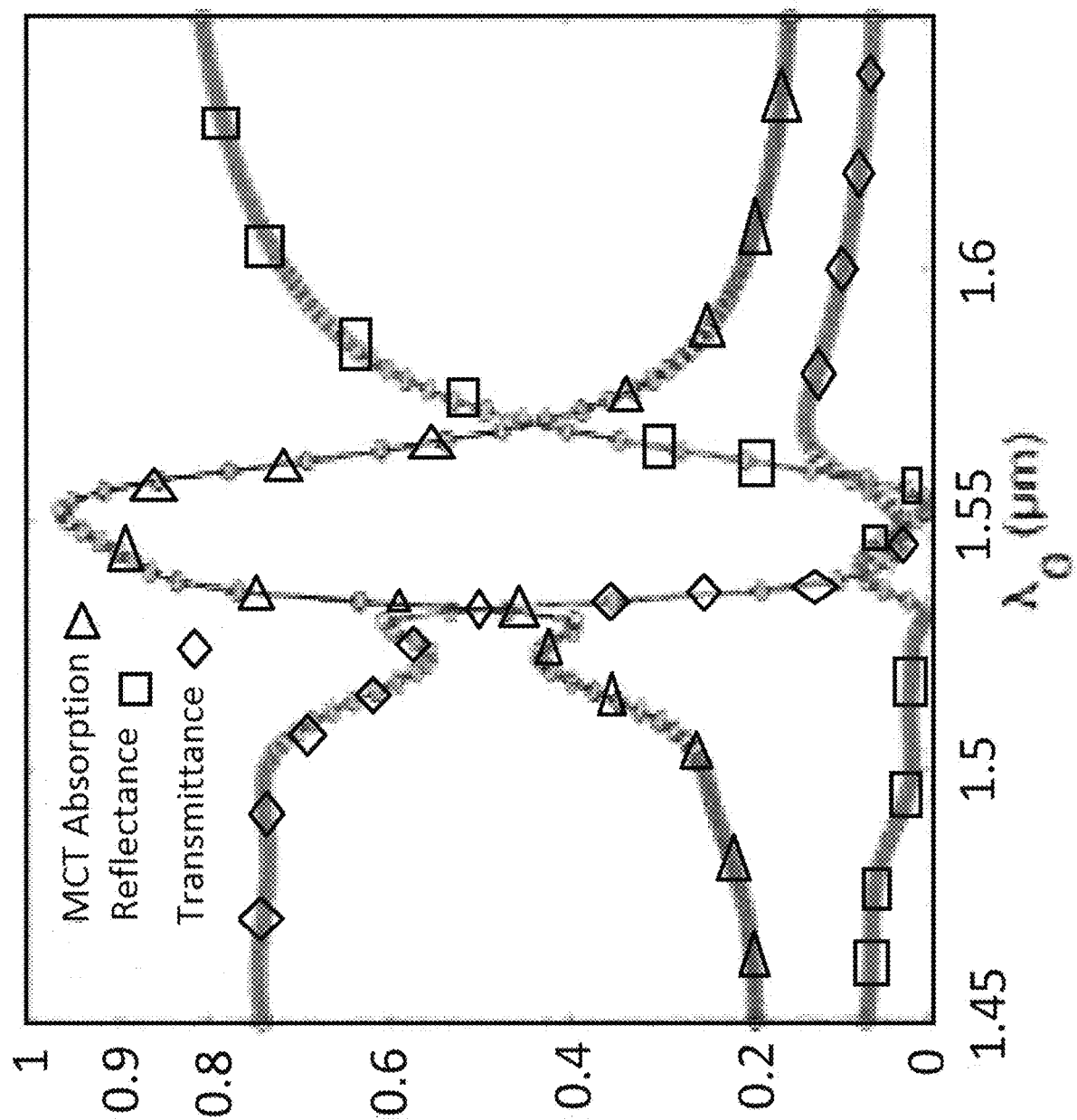
FIG. 1c is a graph of predicted optical properties.

While this invention is susceptible of embodiment in many different forms, there are shown in the drawings, and will be described herein in detail, specific embodiments thereof with the understanding that the present disclosure is to be considered as an exemplification of the principles of the invention and is not intended to limit the invention to the specific embodiments illustrated.

This application incorporates by reference U.S. Provisional Application Ser. No. 63/222,048, filed Jul. 15, 2021, in its entirety.

Single-photon detection is increasingly important to the emerging fields of quantum computation, sensing and cryptography, in addition to more traditional fields that require low-light detection. An exemplary embodiment of the invention includes low-noise, metasurface-coupled HgCdTe single photon avalanche photodiodes (M-SPADs). The M-SPADs will operate at room temperature with photocarriers reaching the multiplication region essentially without time-dispersion, namely in less than 2 ps. This will reduce the jitter time and increase the bandwidth at least by ~30% over state of the art (SOA) HgCdTe APDs operating at 77 K. The exemplary embodiment M-SPAD will not only allow for the accurate detection of single photons, but will also be suited for use in photon coincidence measurements, which are essential to determine entanglement between photons.

One advantageous embodiment, $Hg_{1-x}Cd_xTe$ in a composition range (x=0.7-1.0), has not been significantly studied in the past but has the potential to revolutionize several key technology areas like communications and imaging. The concept can readily be applied to other materials that are used in SPADs.

Currently two leading technologies—superconducting nanowire single-photon detector (SNSPD) and APDs—are used for single photon detection. The SOA SNSPD has a high photon detection efficiency (PDE) of 90% and a jitter time of 70 ps, but operates at 2.1 K. A higher PDE is possible but at the cost of longer jitter times. On the other hand, APDs operate at higher temperatures but with poorer performance. Common InP/InGaAs APDs operate at relatively high temperatures (220 K), but with a PDE of ~30% and a jitter time of ~70 ps. Upconverting Si-APDs have higher PDE of ~60% but require >20 W of power. HgCdTe APDs have a considerably higher gain of over 1000 but operate at 77 K and have a long jitter time of 900 ps. HgCdTe APDs with a SAM architecture have been demonstrated to operate at 296 K but with a low gain of 10 and a high dark current density of ~80 pA/cm². The current performance is inadequate for quantum-information or quantum imaging applications. For room-temperature operation, the dark current density should be 400× smaller, ~0.2 pA/cm².

The exemplary embodiment has considerable advantages including (a) room temperature operation requiring much lower power, size and weight, (b) reduced jitter time, (c) increased gain-bandwidth product, (d) lower shot noise, (e) pixelated detection with high fill-factor, (f) on-chip integration to focal plane arrays (FPAs), and (g) higher detection efficiency.

A transparent metasurface placed on the absorbing HgCdTe layers enables near 100% absorption of 1550 nm light within a 100 nm-thick absorber. Preliminary optical calculations indicate that a similar metasurface structure on an HgCdTe absorber combined with a wider bandgap HgCdTe multiplication layer in a SAM device can achieve breakthrough performance. All of the photons will be absorbed in the 100 nm-thick absorber. The transition and multiplication layers where the field is high are of larger band gap HgCdTe, which will suppress the tunneling component of the dark current. This feature results in several advantages: smaller pulse width and larger gain; since the photons are absorbed within an ultrathin region (100 nm), the avalanche photocurrent pulse will always have nearly the same width; multiple photon absorption within the collection time will result in increased pulse current but with little increase in the pulse width since the superposition is of nearly identical pulses; owing to the essential elimination of carrier injection delay, the current pulse width will be smaller leading to larger bandwidth; lower dark current and noise; restricting absorption to a small thickness (100 nm) reduces the dark current (by about ~30×); restricting absorption to a smaller area (to 20 μm from the 100 μm pitch typically used for SPAD arrays) reduces the dark current further (by about ~25×); reduction in the dark current by about ~750× lowers the noise and enables 300 K operation; timing jitter arising from injection delay is greatly suppressed (by ~20 ps); reduction in the timing jitter increases the bandwidth; restricting absorption to a small volume reduces the shot noise; and quantum efficiency is improved because a thin absorber will contain fewer traps.

The exemplary embodiment incorporates a metasurface on a SAM APD and exploits Mie resonances, to ensure optical absorption takes place within a 100-nm thick HgCdTe absorber layer. The thin absorber layer will rapidly inject carriers into a larger gap HgCdTe multiplier layer and is expected to reduce the avalanche multiplication-related spread of carriers, giving rise to a narrower pulse signal.

The exemplary embodiment will use large bandgap HgCdTe alloys for the multiplication region, leading to low dark current APDs. It will also use a continuously graded HgCdTe transition layer with favorable conduction band offset. The exemplary embodiment will increase quantum efficiency by achieving over 90% absorption of 1550 nm photons and decrease the collection (reset) time and the time jitter by essentially eliminating the drift time in the thin absorption layer. The exemplary embodiment will decrease the avalanche build up time with a large electron impact ionization coefficient likely in a large bandgap HgCdTe alloy for multiplication region, and exhibit low excess noise due to a HgCdTe alloy absorber with the demonstrated large impact ionization coefficient ratio. The exemplary embodiment will automatically eliminate many noise sources that give rise to dark current.

HgCdTe is a high-quality material when grown by MBE on lattice matched CdZnTe substrates and has a higher carrier mobility at room temperature than InGaAs. Additionally, lattice-matched larger band gap transition layers and multiplication layers can be easily grown by continuously varying the Cd concentration without straining the epilayer due to the near identical lattice constants of HgTe and CdTe. HgCdTe APDs have been demonstrated to achieve a noiseless gain of over 1000 at MWIR wavelengths, owing to large difference in impact ionization coefficients of electrons and holes.

While the large gain can ensure higher detection efficiency, the measured signal width may still be larger for single photon detection at high frequency. This is because the carriers are absorbed throughout the absorption region of the APD and the carrier transit to the multiplication region has different points of origin in the device, causing the detected signal to be a sum of multiple avalanche envelopes, which increase the jitter.

To overcome this issue, a meta-structure, or metasurface, is employed on the photon entry surface, receiving photons P, to enable the near full absorption within 100 nm in the absorber. Since all absorption takes place close to the interface, all carriers are injected into the multiplication layer at approximately the same time, and the dispersion in arrival contribution, which is approximately 30% of the total jitter time, is essentially eliminated. Further, with an appropriate choice of Cd concentration in multiplication region, the time associated with avalanche build up is reduced, leading to the reduction of two of the three major contributors to the jitter. The third contribution arises from the nonuniform electric field and the associated lateral spread in avalanching.

It is possible to exploit both size-dependent Mie resonance and total internal reflection from a low index substrate to achieve high absorption with a very thin absorber, as shown in FIG. 1. Mie-resonance pillars 20 made of transparent HgCdTe (FIG. 1a) enhance the field strength in the HgCdTe absorber layer 26 and the low index substrate 32 enables total internal reflection, thus further enhancing the absorption in the 100 nm-thin layer (FIG. 1b) to well over 95% (FIG. 1c) at 1550 nm.

Figure 2A:
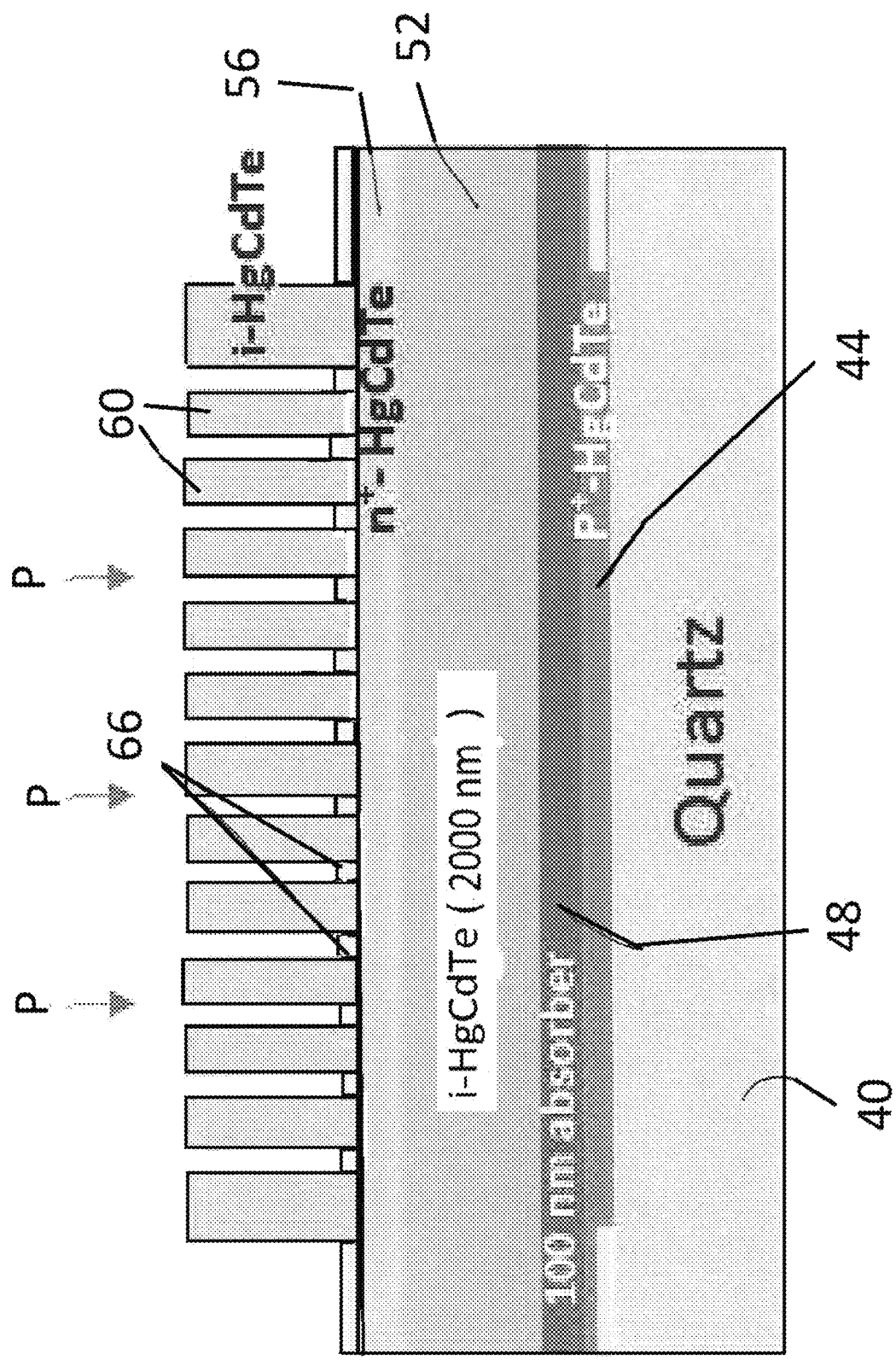
FIG. 2a is a schematic sectional view of a diode embodiment of the present invention.
Figure 5:
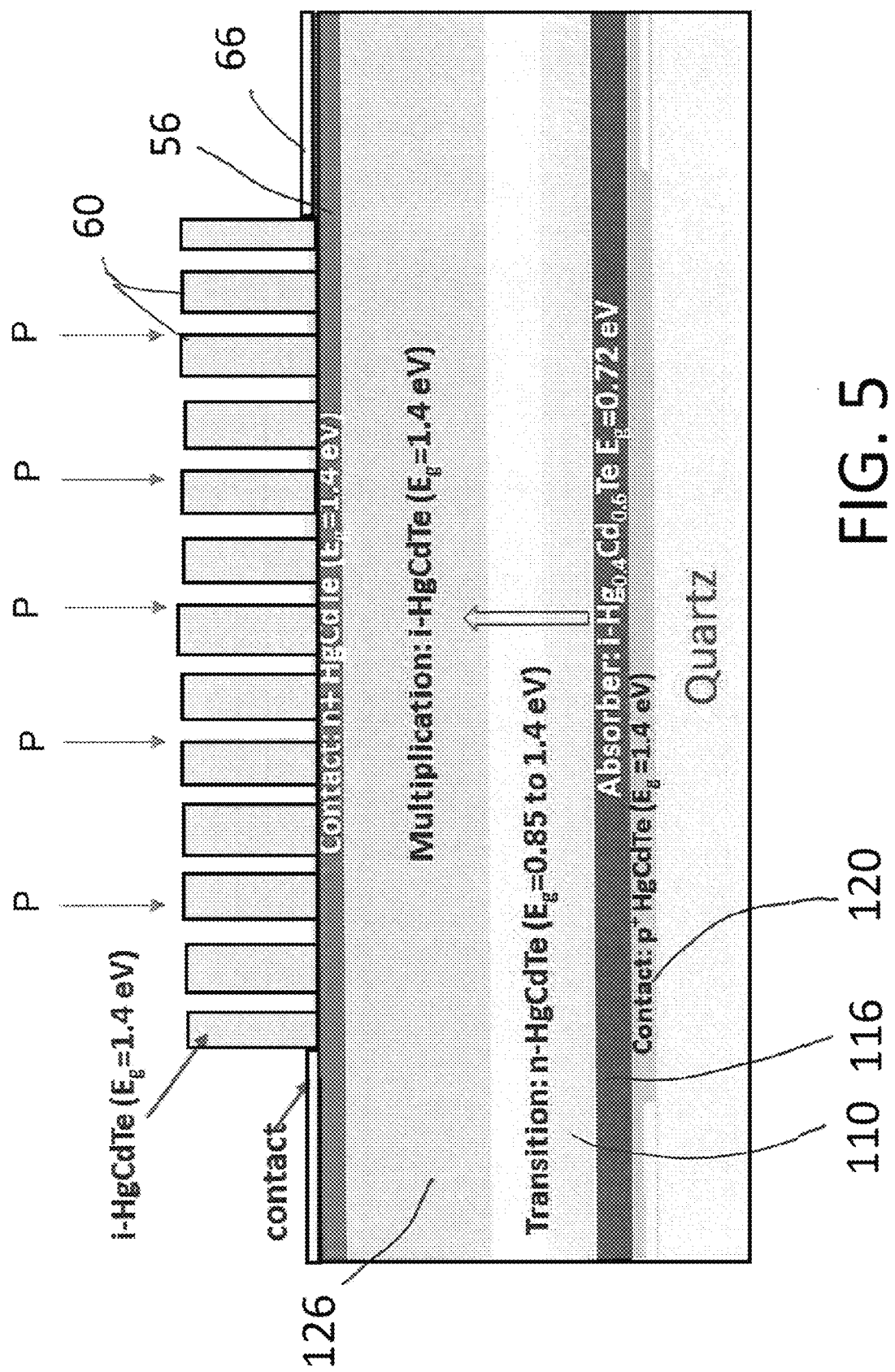
FIG. 5 is a schematic sectional view of another embodiment HgCdTe APD of the invention.

The pillars 20, 60, shown in FIGS. 1a, 2a and 5, can be 0.7 µm in width, and spaced at 1 µm, in both horizontal axes in the plane of the photodiode, forming a grid. The pillars 20, 60 can have a height from the underlying layer, such as the absorber layer 26 or the contact layer 56, of about 700 nm, determined by the wavelength of operation and refractive index of the pillar material at that wavelength. The invention encompasses values different from the preceding values of width, spacing and height.

A metasurface-assisted absorption enhancement is illustrated in FIG. 2a. An exemplary embodiment (FIG. 2a) consists of quartz substrate 40, doped HgCdTe layer 44 for contact, a 100 nm-thick absorbing HgCdTe layer 48 ($E_g$=0.75 eV), larger bandgap HgCdTe layer 52 ($E_g$=1.25 eV)—denoting the transition and multiplication layers—, doped HgCdTe layer 56 for top contact, and non-absorbing, transparent metasurface 60 made of HgCdTe.

Figure 2B:
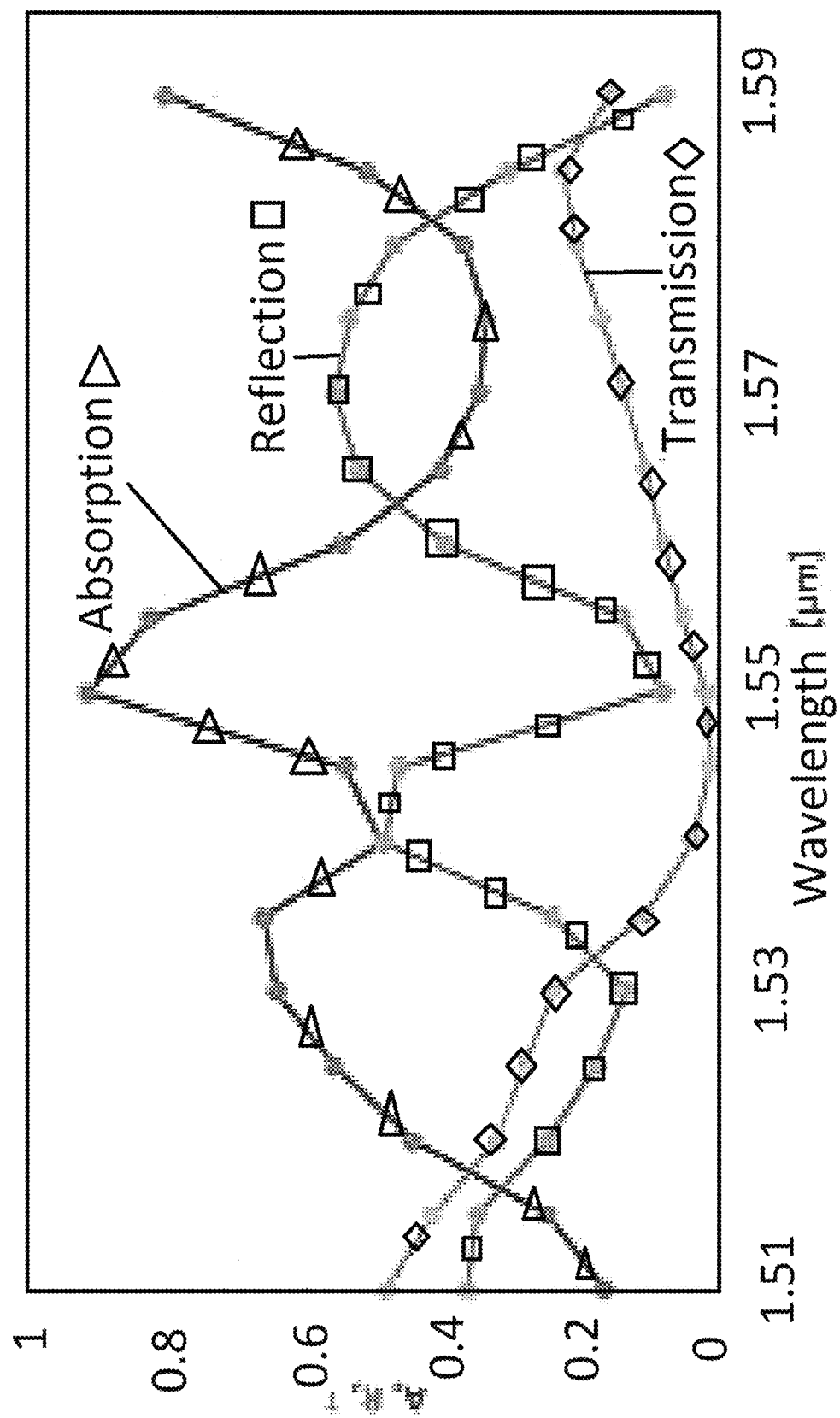
FIG. 2b is a graph of predicted optical properties.

The metasurface and appropriately chosen transition layer, ultra-thin (100 nm) HgCdTe absorber layer, and low index substrate (quartz) is an improvement over a conventional APD. The COMSOL model for this design predicts very high absorption (FIG. 2b, blue) at 1550 nm wavelength. It is important to note that high absorption is expected even though the space between the pillars is covered by metal 66, which can serve the function of collecting the photocarriers. This is because the Mie-resonant pillars behave like nano antennas by funneling the incident light into the absorber with very little light impinging on the metal for reflection. This feature has been demonstrated in broadband in the visible spectrum.

Figure 2C:
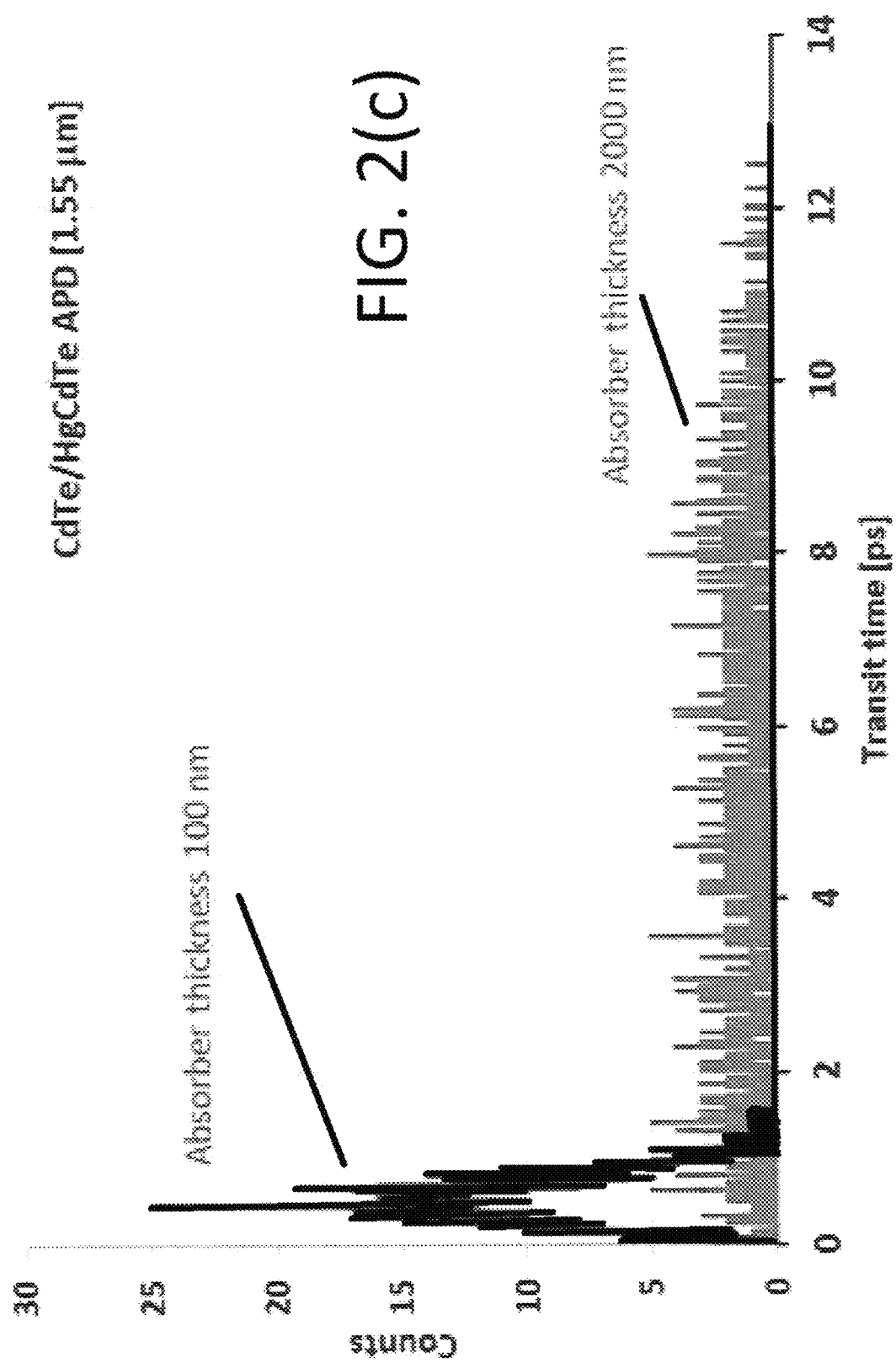
FIG. 2c is a graph of predicted transit time in 100 nm-thick M-SPAD compared to a conventional 2000 nm-thick absorber.

Further, the full-band structure-based Monte Carlo codes are used to calculate the transit time of the photocarriers across the absorber. Impact ionization is possible in the absorber, so it is important to note that the impact ionization rates of electrons and holes are calculated in the code and any contribution from buildup time arising due to randomness in avalanching, and the injection delay time, are naturally included. The calculated transit time across the absorber of the electrons/holes created by 1000 randomly absorbed 1550 nm photons are plotted (FIG. 2c) for two cases—the exemplary embodiment (red) and a 2000 nm-thick absorber with no metasurface (blue)—for an assumed applied field of 150 kV/cm, which is much smaller than the estimated breakdown field of 250 kV/cm for this SWIR HgCdTe alloy.

Notice that the photocarriers are created in close proximity to each other within 100 nm when the metasurface is present and, consequently, the predicted photocurrent pulse width at the multiplication interface is narrow (~1 ps) with a maximum injection delay<2 ps. These values are 12× and 6× shorter than that expected from a conventional APD with a typical absorber thickness of 2000 nm. For a 3000 nm-thick absorber, these transit times will be even longer. This reduction in pulse width will result in a lower jitter time and a net increase in the bandwidth. The timing jitter is defined as the statistical fluctuations of the time interval between the arrival photon at the detector and the output pulse leading edge and has three contributions: injection delay controlled by the thickness of the absorber; avalanche build-up time controlled by the thickness and electron-hole impact ionization ratio of the multiplication layer; and lateral spread of avalanche, which is determined by the lateral diffusion of the initial avalanche. For exact jitter time values, the avalanche buildup time and avalanche spread time in the multiplication region should be included and integrated with a COMSOL model in which electric field distribution in the device will be calculated. As can be seen, the M-SPAD design essentially eliminates the jitter time contribution arising from the injection delay without requiring higher field or increasing the dark current, and likely obtains a lower avalanche buildup time from a larger gap HgCdTe alloy multiplier.

The exemplary embodiment provides several advantages:

A. High quantum efficiency. By limiting photon absorption to a thin layer, out of which photogenerated carriers drift quicky, the chance of recombination—both radiative and non-radiative—is reduced. Consequently, more photogenerated carriers will participate in the impact ionization and lead to a higher quantum efficiency.

B. Low dark current and high temperature operation. By using <1/30th of conventional absorption layer thickness, the dark currents—both thermal and band-to-band—are reduced. In addition, a thinner absorbing layer has drastically reduced Shockley-Read-Hall centers, which would lead to a lower dark current. With larger gap transition and multiplication layers, the tunneling currents are reduced, further lowering the dark current, which enables high operating temperature, signal-to-noise ratio and lower power consumption as cooling is not required.

C. Shorter timing jitter and large bandwidth. Since all photocarriers are generated in a thin HgCdTe layer and injected into the multiplication region essentially eliminating the delay in the injection time and reducing the shot noise, a higher gain-bandwidth product is expected. Further, the preliminary calculations of high field transport across the thin absorber layer suggest that nearly all carriers reach the multiplier within ±0.5 ps of the peak. This contrasts with the carriers being distributed over ~20 ps when the absorption takes place uniformly over a 3 µm-thick absorber. Thus, the contributions to the timing jitter are reduced with use of (1) a metasurface which essentially eliminates injection delay and (2) a larger bandgap HgCdTe alloy multiplier which is likely to reduce the avalanche buildup.

The exemplary embodiment achieves significantly improved quantum efficiency, much suppressed dark current, and reduced timing jitter. The metasurface-coupled APD represents a new strategy to improve APD performance.

Room-Temperature SWIR APDs are Proposed.

To operate in a low-photon flux condition, an avalanche operation mode can be used to enhance the signal to noise ratio (SNR). To cover near infrared (NIR, 0.7-1.0 µm)/SWIR (1.0-2.5 µm) wavelength ranges, the $Hg_{1-x}Cd_xTe$ APD-based FPA is an exemplary choice to satisfy the requirements. An $In_xGa_{1-x}As$-based FPA is another potential candidate for this application, however, it has limitation in SWIR wavelength range when compared with a HgCdTe-based FPA. The lattice parameter a of $In_xGa_{1-x}As$ semiconductor depends on its composition, the x-value, which changes from a=5.65 Å for GaAs (x=0, energy gap $E_g$=1.435 eV) to a=6.06 Å for InAs (x=1, $E_g$=0.35 eV). With the exception of $In_{0.53}Ga_{0.47}As$ that is lattice matched to InP, all other x-value materials grown on InP substrates are not lattice-matched. $In_xGa_{1-x}As$ layers with sub-critical thickness (~nm) can be grown defect-free, but the growth of thicker layers is accompanied by the generation of dislocations and other defects. Efficient absorption of infrared radiation often requires layers much thicker (~3 µm) than the critical thickness, therefore, dislocations are inevitable in the growth process. Lattice mismatch also presents significant limitations to the growth of larger gap transition layers and even larger gap multiplication layers in SAM APDs.

The growth of high-quality HgCdTe-based semiconductors is a mature technology. The difference in lattice parameter between CdTe (x=1, $E_g$=1.5 eV) and $Hg_{0.4}Cd_{0.6}Te$ (x=0.6, $E_g$=0.720 eV) is ~0.2%. Replacing a small fraction of cadmium (Cd) with zinc (Zn) or tellurium (Te) with selenium (Se), or small tuning of the composition of the $Cd_{1-x}Zn_xTe$ substrate, can compensate any residual lattice mismatch. The near independence of lattice parameter on composition is a major advantage of HgCdTe over most other bulk alloys. Due to this difference, it is not surprising to see that the performance of InGaAs photodiodes decreases rapidly with increasing wavelengths due to mismatch-induced defects, while HgCdTe photodiodes maintain high performance close to the ultimate limit over a wider range of wavelengths.

The advantages of HgCdTe-based APDs are primarily due to HgCdTe's asymmetric band structure. Most semiconductors (including InGaAs) have band structure configurations that promote phonon scattering and primary carrier ionization by high energy carriers. Moreover, the presence of low-lying secondary conduction band minima and shallow split-off valence bands further reduces the asymmetry in impact ionization coefficients of these materials. However, HgCdTe has none of these band structure drawbacks. Its avalanche processes are usually heavily dominated by electrons, and hence HgCdTe-APDs can achieve high gains without reaching breakdown.

Figure 3:
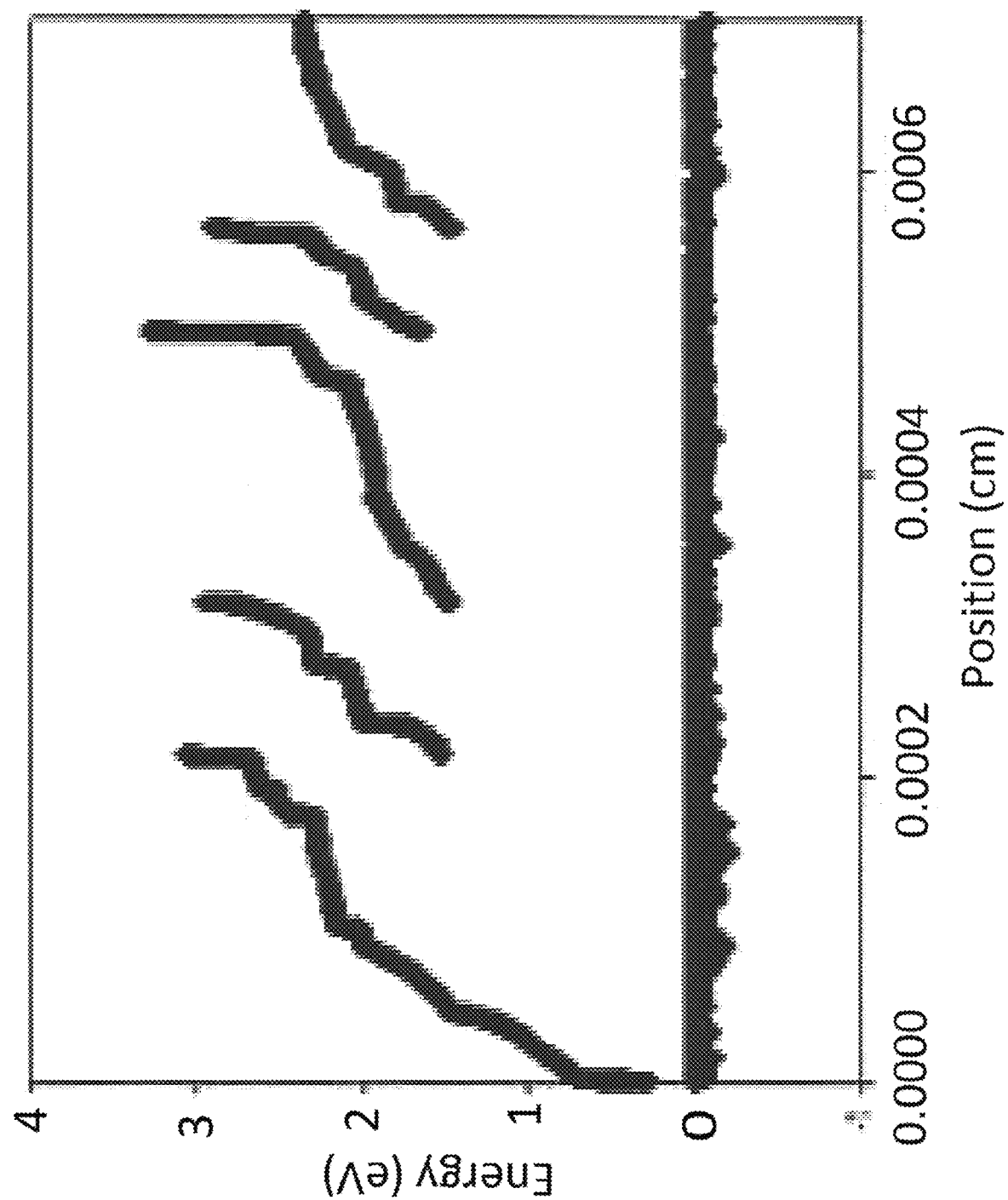
FIG. 3 is a graph of computed carrier energy as a function of positions for electrons, (positive energy) and heavy and light holes (zero and negative energy) for an HgCdTe MWIR APD under an electric field of 15 kV/cm at T=300 K.

FIG. 3 shows a simulated example of an electron-dominated avalanche process in an MWIR HgCdTe-APD via Monte Carlo device simulation. Electron-initiated impact ionization is the dominant process, while light and heavy holes scatter too rapidly to reach their respective impact ionization thresholds. HgCdTe has demonstrated to be the best-performing APDs in the MWIR (3-5 µm). The most significant features of HgCdTe devices are the uniform APD gain, which increases exponentially with applied bias, the absence of avalanche breakdown, and the low excess noise factor F. These almost ideal APD characteristics are explained by the much smaller electron than hole effective mass for HgCdTe semiconductors and large energy separation between the minimum at Γ and that of the satellite valleys, which are dominantly responsible for a much larger ionization coefficient for electrons (α) than for holes (β). The avalanche gain is mainly caused by electron multiplication over a large range of HgCdTe compositions.

Figure 4:
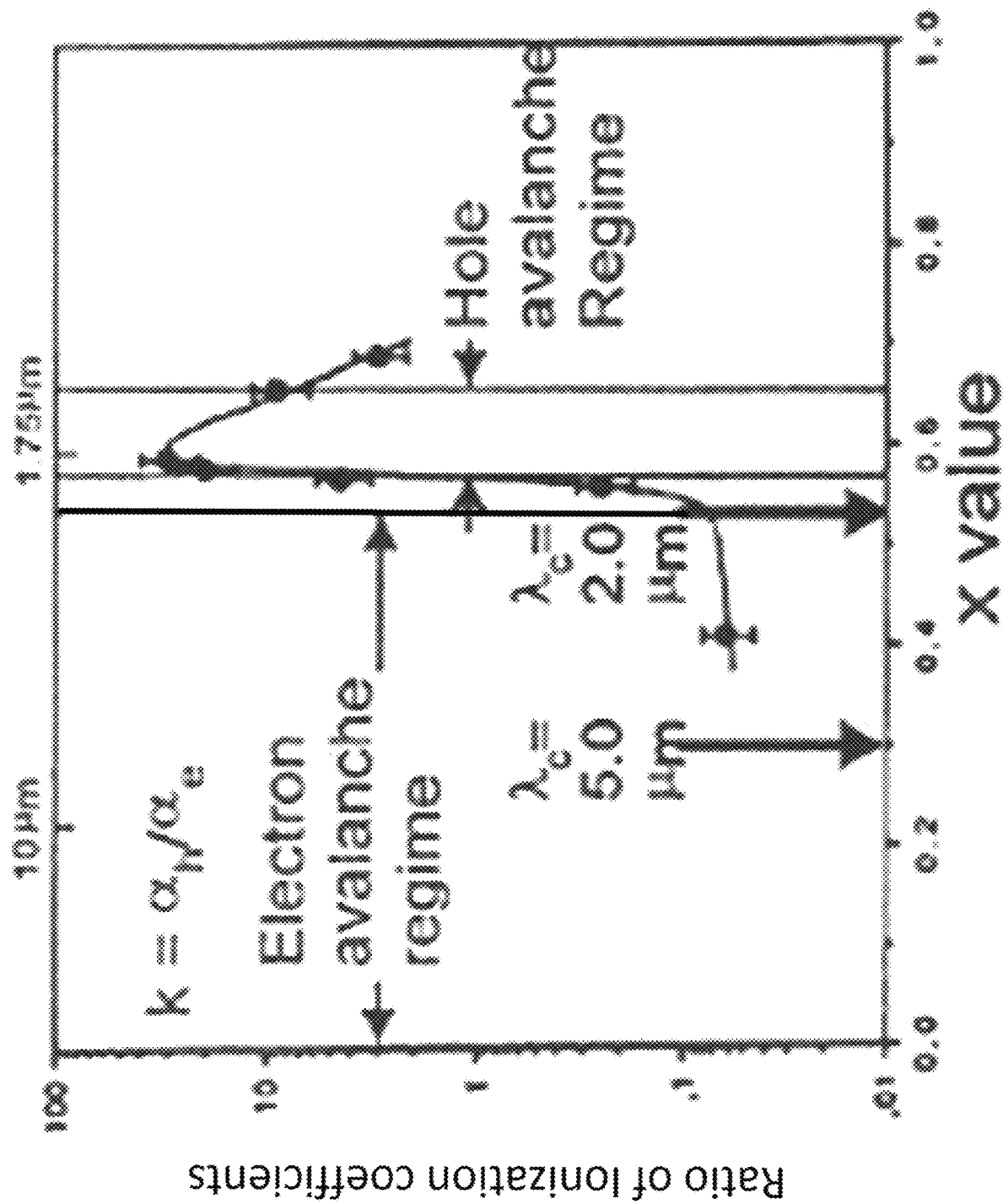
FIG. 4 is a graph of the ratios of ionization coefficients, k=β/α as a function of Cd value composition, hole-dominated avalanche happens at x value=0.6, roughly 1.75 μm wavelength.

In the short-wave infrared (SWIR) wavelength range, the impact ionization coefficient ratio k (=β/α) of HgCdTe has been reported to undergo a dramatic change as shown in FIG. 4 when the spin-orbit-splitting energy Δ is equal to the band gap energy $E_g$. When Δ is very close to $E_g$ in $Hg_{1-x}Cd_xTe$ alloys at x ~0.6 (wavelength of 1.75 µm), the k value reaches its maximum (~30) due to the resonance between band gap $E_g$ and Δ. This results in a hole-dominated avalanche process, which is attributed to impact ionization initiated by holes from the split-off valence band.

Specifically, the threshold energy for hole-initiated impact ionization ($E_{ih}$) reaches the smallest possible value ($E_{ih}=E_g$) and the ionization process occurs with zero momentum change. With increasing x-value, the k values appear to become small and the avalanche becomes electron-dominated again.

However, there have been no in-depth avalanching studies—theory or experiment—reported for x>0.7, a critical region for larger bandgap multiplication region in the APD SAM structure which will allow further reduction in the dark currents, increase of the applied field much higher to obtain larger gains, and room-temperature operation. If, as it appears in FIG. 4 by linear extrapolation, the large gap HgCdTe become an electron avalanching alloy with k value<0.1, it will be advantageous to use, for example, a HgCdTe alloy with Cd concentration (xCd) of 0.95 with a band gap of 1.4 eV at room temperature) as the multiplication region for e-initiated APD behavior. This large asymmetry in electron- and hole-impact-ionization coefficients favors electrical stability, high gain-bandwidth products and low excess-noise.

Figure 6:
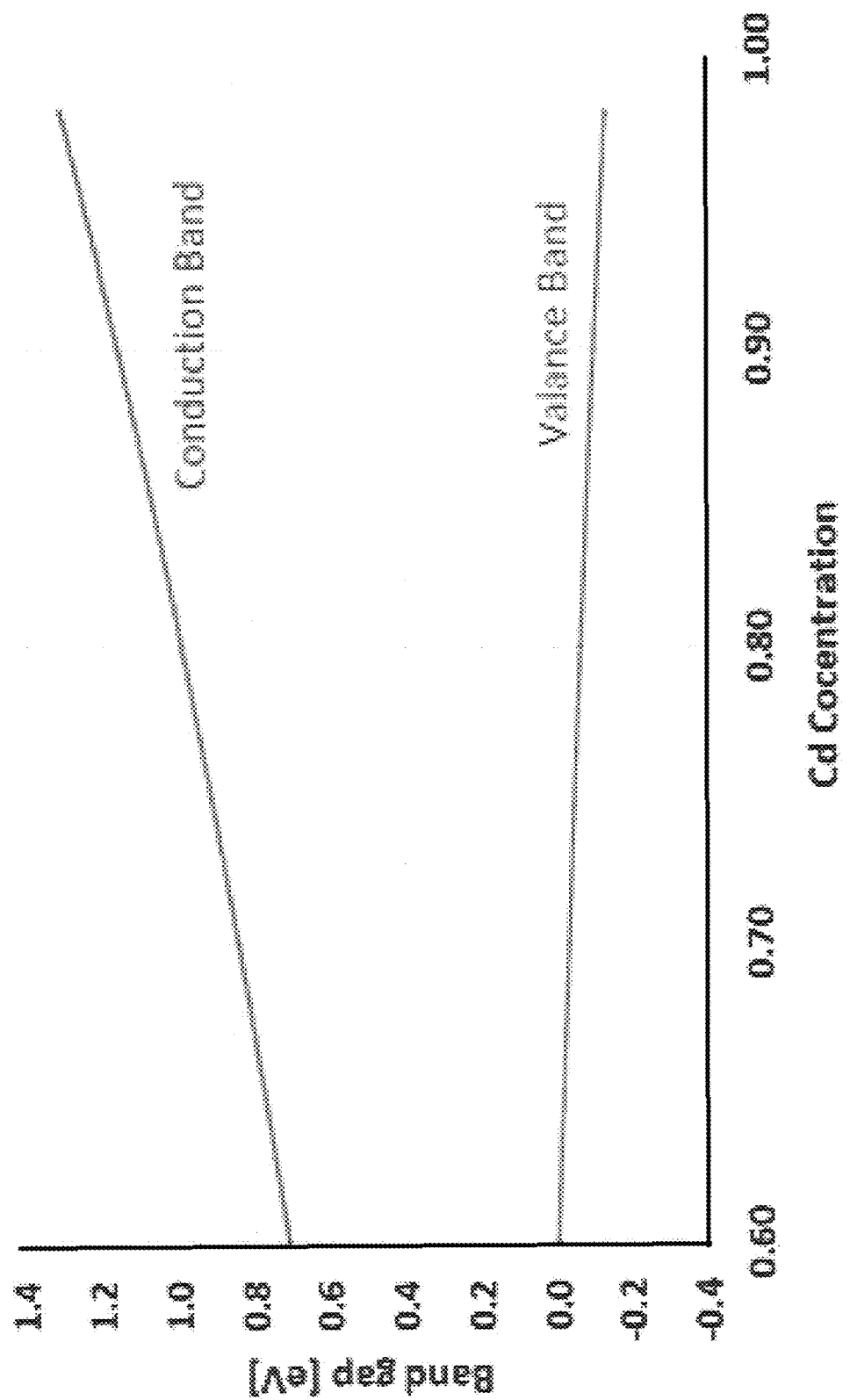
FIG. 6 is a graph of Cd concentration-dependent valence and conduction bands of graded HgCdTe alloys, referenced to the valence band edge of the absorber.

A full architecture of an exemplary embodiment device is shown in FIG. 5. The transition layers 110 can be composed of $Hg_{1-x}Cd_xTe$ with 0.7<x<0.9 and an absorber layer 116 is composed of $Hg_{0.4}Cd_{0.6}Te$. A photon absorbed in the absorber will create an e-h pair; the holes will be collected at a bottom contact 120, and the electrons will be accelerated to a multiplication layer 126 through the transition layers 110. However, the electron injection efficiency depends on the band offsets of the transition and multiplication regions. The predicted valence band (blue) and conduction band (red) variation as a function x are shown in FIG. 6. All energies are referenced to the valence band of the absorber. The barrier energy for electrons between the absorber and the multiplication regions is high (~400 meV) where that for holes is very small (~100 eV).

With concentration grading, appropriate n-doping, and suitable electric field across the transition layer, the electron can be made to overcome the apparent conduction band offset of ~400 meV and achieve almost complete injection into the multiplication layer. The fundamental calculation of impact ionization coefficients in high Cd concentration HgCdTe alloys, and COMSOL-based optical modeling which includes the band structure-based high field transport, can identify the Cd profile, n-doping profile, layer thicknesses, electric field strength for optimum APD performance at room temperature.

A high-quality HgCdTe absorber, larger band gap HgCdTe transition and multiplication layers, and transparent HgCdTe for metasurface fabrication will be grown on CdZnTe using an MBE system. The epilayer structure will be transferred to a quartz substrate. The integrity of the transferred layer will be evaluated by validating the thicknesses and evaluating the optical performance before and after transfer. The optical measurements will include reflection, transmission, and absorption of 1550 nm light as function incident angle and comparison with modeled values.

When the pulse in the time domain is expanded in the frequency domain, it will have several frequency components centered around the main frequency (corresponding to 1.55 µm wavelength). Hence, the metasurface should be able to perform equally well for all those frequencies. This requires COMSOL solutions to Maxwell's equations in the time domain and the metasurface design can be optimized for reasonable bandwidth.

To improve metasurface-coupled APD performance by reducing dark current and increasing quantum efficiency, each layer of the detector's vertical layer structure can be optimized by tailoring doping and depths of diffusion for the known band offsets.

The high degree of control required to fabricate precise surface features leading to enhanced absorption may not be reached using conventional wet etching. An engineering approach will be implemented to make use of past experience, and state of the art equipment and techniques. Among several dry etching techniques, inductively coupled plasma (ICP) etching has been reported to result in high uniformity of the etch process over large wafers with low damage. An ICP etch process for HgCdTe on an Oxford Instruments Plasma Lab 100 ICP chamber that has a gas pod with mass flow controllers for CH4, H2, N2, O2, Ar and SF6, a temperature controller with helium back flow, a custom gas ring to feed gases directly over a three-inch wafer, and two separate power supplies for controlling plasma density and ion energy can be used. The processing methods can be validated by examining scanning electron microscope (SEM) images of the obtained nanopillars. Optical characterizations of metasurface will be performed to demonstrate the effect of metasurface on optical absorption HgCdTe. Optical absorption spectra of:

(1) CdZnTe (substrate)/2000 nm-thick $Hg_{0.5}Cd_{0.5}Te$/2000 nm-thick $Hg_{0.3}Cd_{0.7}Te$, (2) quartz (substrate)/100 nm-thick $Hg_{0.5}Cd_{0.5}Te$/2000 nm-thick $Hg_{0.3}Cd_{0.7}Te$/metasurface, and (3) quartz (substrate)/100 nm-thick $Hg_{0.5}Cd_{0.5}Te$/2000 nm-thick $Hg_{0.3}Cd_{0.7}Te$/metasurface will be measured. The objective is to show near identical absorption and high absorption with the metasurface structure.

After several decades of R&D, MBE has emerged in recent years as a flexible manufacturing technology for HgCdTe and offers the greatest control over crystal growth. Not only has crystal quality significantly improved, doping mechanisms have also been better understood in this deposition method and the dopant incorporation rate can be accurately controlled by carefully measuring fluxes during the growth. The versatility of MBE to generate graded compositions with controlled doping, as well as large number of successive layers with different properties in one single run is crucial to achieving the complex structure proposed here. FIG. 5 shows an example of such a device structure.

The fabricated and tested MBE-grown structures will be transferred to a quartz substrate. This will expose the epitaxial layers at the interface with the substrates and allow completion of the APD device through ex-situ ion-implantation to achieve the correct p-type doping.

From the foregoing, it will be observed that numerous variations and modifications may be effected without departing from the spirit and scope of the invention. It is to be understood that no limitation with respect to the specific apparatus illustrated herein is intended or should be inferred.

The invention claimed is:

1. A photon avalanche diode, comprising:
   a quartz substrate;
   a doped HgCdTe contact layer on the substrate;
   an absorbing HgCdTe layer on the contact layer;
   a larger bandgap HgCdTe layer on the absorbing layer;
   a doped HgCdTe layer for a top contact layer on the larger bandgap HgCdTe layer; and
   a non-absorbing HgCdTe metasurface on the top contact layer.

2. The photon avalanche diode according to claim 1, wherein the larger bandgap HgCdTe layer comprises a transition layer on the absorbing HgCdTe layer and a multiplication layer on the transition layer.

3. The photon avalanche diode according to claim 1, wherein the absorbing HgCdTe layers is about 100 nm-thick or thinner.

4. The photon avalanche diode according to claim 1, wherein metasurface comprises pillars arranged spaced-apart and extending from the top contact layer.

5. The photon avalanche diode according to claim 4, wherein the pillars are arranged in a grid.

6. The photon avalanche diode according to claim 5, wherein the pillars are approximately 0.7 µm in width, and are spaced apart at 1 µm, in both horizontal axes in the plane of the photodiode.

7. The photon avalanche diode according to claim 5, wherein the pillars
   have a height from the top contact layer of about 700 nm.

8. A photon avalanche diode, comprising:
   a substrate;
   an absorbing layer above the substrate;
   a non-absorbing metasurface above the absorbing layer; and
   a larger bandgap multiplication layer between the absorbing layer and the metasurface; wherein the larger bandgap multiplication layer comprises HgCdTe.

9. The photon avalanche diode according to claim 8, wherein the metasurface comprises pillars arranged spaced-apart and extending upward from the absorbing layer.

10. The photon avalanche diode according to claim 9, wherein the pillars are arranged in a grid.

11. The photon avalanche diode according to claim 10, wherein the pillars are approximately 0.7 µm in width, and are spaced apart at 1 µm, in both horizontal axes in the plane of the photodiode.

12. The photon avalanche diode according to claim 11, wherein the pillars have a height from the absorbing layer of about 700 nm.

13. The photon avalanche diode according to claim 8, wherein the absorbing layer comprises HgCdTe and the non-absorbing metasurface comprises HgCdTe.

14. The photon avalanche diode according to claim 8, further comprising:
   a doped HgCdTe contact layer on the substrate; and
   a doped HgCdTe layer for a top contact layer on the larger bandgap HgCdTe layer.

15. A photon avalanche diode, comprising:
a substrate;
an absorbing layer above the substrate; a non-absorbing metasurface above the absorbing layer; and
comprising a multiplication layer on the absorbing layer and a transition layer on the multiplication layer below the metasurface.

16. The photon avalanche diode according to claim 15, comprising a top contact layer below the metasurface and on the transition layer.

17. The photon avalanche diode according to claim 16, comprising a bottom contact layer between the substate and the absorbing layer.

18. A photon avalanche diode, comprising:
a substrate;
an absorbing layer above the substrate;
a non-absorbing metasurface above the absorbing layer; and
wherein the absorbing layer is approximately 100 nm-thick or thinner.

* * * * *